United States Patent [19]

Ohikata et al.

[11] Patent Number: 5,150,198
[45] Date of Patent: Sep. 22, 1992

[54] RADIATOR FOR SEMICONDUCTOR CHIP

[75] Inventors: Naoharu Ohikata; Toshio Yamamoto; Masashi Konda, all of Tokyo, Japan

[73] Assignee: Nippon Steel Corporation, Tokyo, Japan

[21] Appl. No.: 669,520

[22] Filed: Mar. 14, 1991

[30] Foreign Application Priority Data

Mar. 15, 1990 [JP] Japan ................................. 2-65290

[51] Int. Cl.$^5$ .............................................. H01L 23/02
[52] U.S. Cl. ........................................ 357/81; 357/72; 357/73; 357/74; 357/80
[58] Field of Search ....................... 357/81, 72, 73, 74, 357/80

[56] References Cited

U.S. PATENT DOCUMENTS 4,943,844 7/1990 Oscilowski et al. .................. 357/81
4,953,173 8/1990 Fujitsu ................................. 357/81

Primary Examiner—Georgia Y. Epps
Attorney, Agent, or Firm—Cushman, Darby & Cushman

[57] ABSTRACT

A radiator for a semiconductor chip is provided which is made from a material having good heat conductivity. The radiator is plate shaped and is attached to the semiconductor chip. The radiator has at least one projection on the outer peripheral edge thereof so as to extend outwardly, laterally beyond the outer periphery of the semiconductor chip. The semiconductor chip and the radiator are sealed within plastic so that the projection of the radiator extend outwardly from the plastic encapsulation. Heat from the semiconductor chip is released from the plastic encapsulation via the projection(s) of the radiator. The radiator can be formed from a material which also has good electrical conductivity to electrically protect the semiconductor chip.

25 Claims, 3 Drawing Sheets

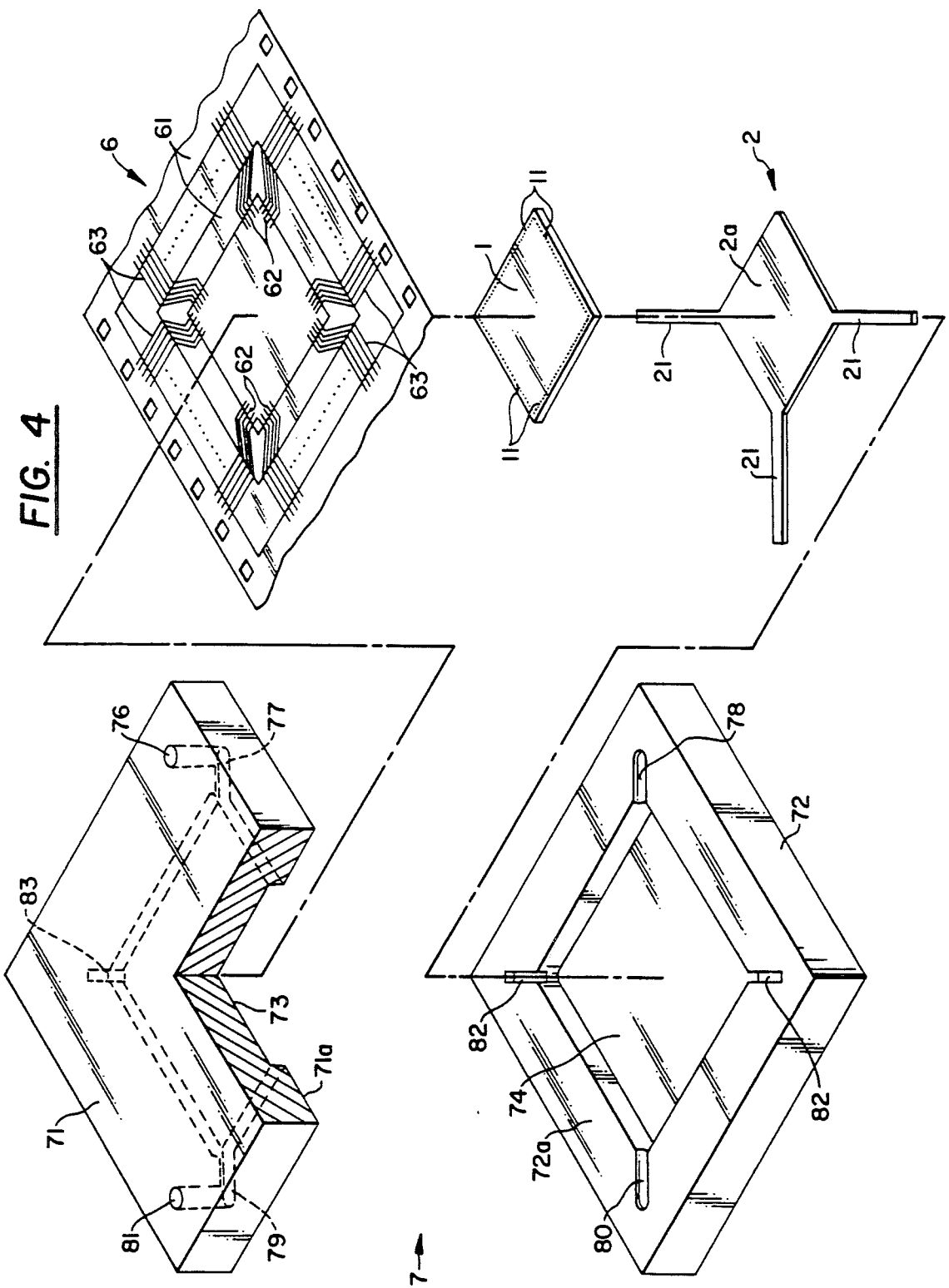

RADIATOR FOR SEMICONDUCTOR CHIP

BACKGROUND OF THE INVENTION

This invention relates to a radiator for a semiconductor chip, particularly for a highly integrated semiconductor chip such as LSI chip and VLSI chip.

In recent years, semiconductor chips have been sealed with plastic to protect circuitry from moisture and other damage. Plastic encapsulation of the semiconductor chip is generally effected by transfer molding or the potting method. In the latter, only the active surface of the semiconductor chip is sealed by dropping plastic on the active surface. With the potting method, however, moisture can not be effectively prevented because the remainder of the semiconductor chip is exposed to the atmosphere. For that reason, plastic encapsulation of the semiconductor chip is effected by transfer molding in most cases. With transfer molding, the entirety of the semiconductor chip is enclosed with plastic such as epoxy resin and silicone resin.

However, there is a problem with plastic encapsulation by transfer molding. More particularly, it is hard to release heat from the semiconductor chip because the entirety of the semiconductor chip is sealed with plastic. This problem becomes serious as the integration of circuit of semiconductor chip progresses and the electric power per unit area of semiconductor chip increases. A plastic encapsulation configuration having radiation fins has been proposed to address this problem. However, cooling through plastic encapsulation is not very effective because plastic has a low heat conductivity. In addition, the provision of such radiation fins to plastic encapsulation hinders the miniaturization of the semiconductor package which mainly comprises the sealed semiconductor chip and leads extending outwardly therefrom.

In addition, another problem with semiconductor chips as the integration of internal circuit progresses has been discovered. A highly integrated semiconductor chip requires electrical protection. Otherwise, it is apt to become charged with external static electricity. Indeed, the internal circuit can be destroyed by a spark if a charged human body or the like touches the semiconductor chip or the internal circuit may erroneously operate due to current induced by pulsive electromagnetic wave noise. In addition, the ground potential of the semiconductor chip tends to deviate due to the inductance of leads.

SUMMARY OF THE INVENTION

Accordingly, it is an object of the present invention to provide a radiator for semiconductor chip which can effectively release heat from the semiconductor chip even if the entire semiconductor chip is sealed with plastic.

It is another object of the present invention to provide a radiator for semiconductor chip which does not hinder the miniaturization of the semiconductor package, particularly with minimal increase in the thickness of the semiconductor package.

It is still another object of the present invention to provide a radiator for a semiconductor chip which can easily be arranged to electrically protect of the semiconductor chip.

The radiator for a semiconductor chip according to the invention is made of a material which has a good heat conductivity into a plate shape to be attached to the semiconductor chip, the radiator having at least one projecting portion defined on the periphery thereof so as to extend outwardly laterally beyond the outline of the semiconductor chip. The radiator can be made of material having a good electrical conductivity too.

The above and other objects, features and advantages of the invention will be apparent from the following detailed description which is to be read in conjunction with the accompanying drawings.

BRIEF DESCRIPTION OF THE DRAWINGS

FIG. 4 is an exploded view of a mold for sealing the radiation plate and the semiconductor chip of FIG. 1.

DETAILED DESCRIPTION OF THE PREFERRED EMBODIMENT

Figure 1:
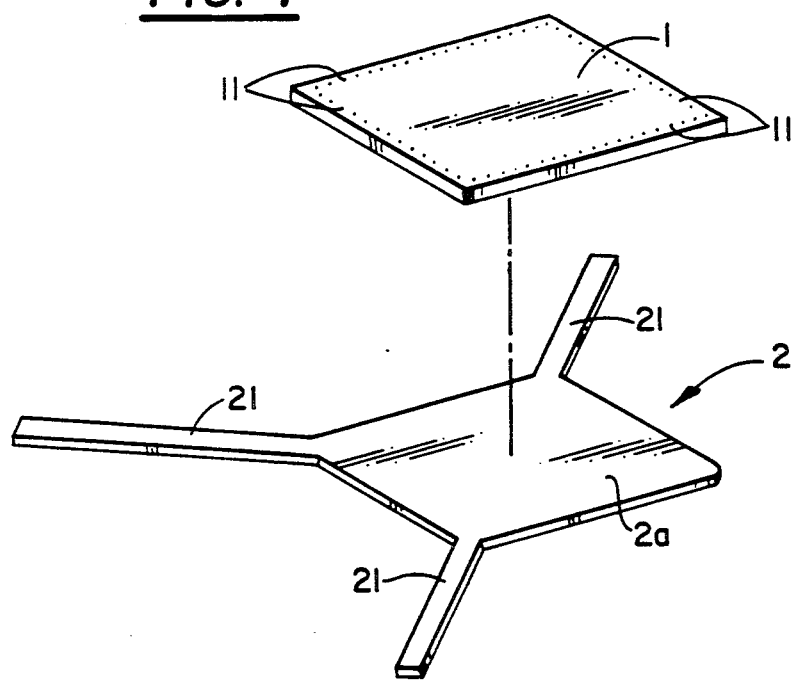
FIG. 1 is a perspective view of a radiation plate and a semiconductor chip according to the invention.

Referring first to FIG. 1, a radiation plate 2 is attached to the back surface (the surface which does not include electrodes 11) of a semiconductor chip 1. The radiation plate 2 is made from a material having a good electrical conductivity as well as a good heat conductivity such as 42-alloy of Fe-Ni or copper. The nearly square radiation plate 2 has a flat bonding surface 2a for bonding to the semiconductor chip 1. The radiation plate 2 is provided with three projections 21 which are integrally formed with the to extend outwardly, laterally from three corners of the radiation plate 2 in a diagonal direction. Each projection 21 is long enough to extend beyond the outline of the semiconductor chip 1 when the radiation plate 2 is attached to the semiconductor chip 1. The radiation plate 2 has a side dimension of about 8 mm and the a thickness of about 0.1 to 0.2 mm when the nearly square semiconductor chip 1 has a side dimension of about 8 mm and a thickness of about 0.4 mm. The length of each projection 21 is about 12 mm. The radiation plate 2 is bonded to the semiconductor chip 1 with electrically conductive adhesive, for example.

Figure 2:
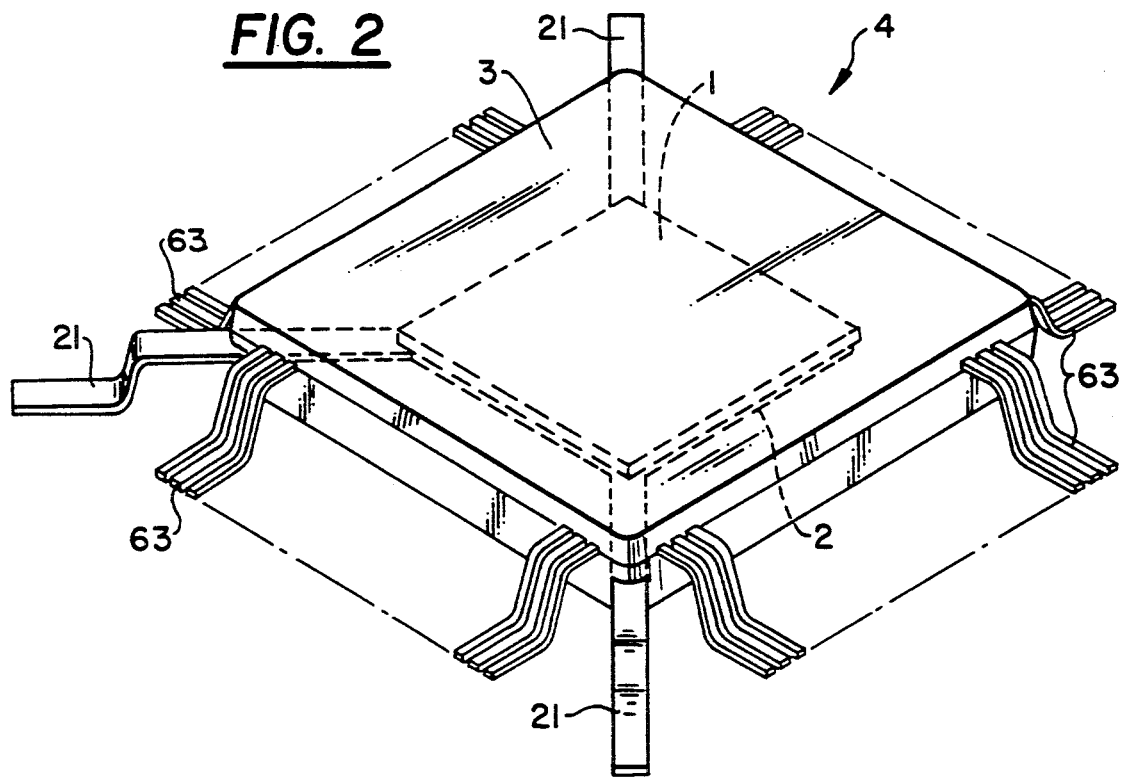
FIG. 2 is a perspective view of a semiconductor package in which the radiation plate and the semiconductor chip of FIG. 1 are sealed with plastic.

As shown in to FIG. 2, the semiconductor chip 1 with the radiation plate 2 attached thereto are sealed with plastic so that only leads 63 of the semiconductor chip 1 and the three projections 21 of the radiation plate 2 are exposed, extending outwardly from the plastic encapsulation 3. A nearly square semiconductor package 4 thus formed has a side dimension of about 15 to 18 mm and a thickness of about 2 mm. In this construction, the projections 21 can be disposed within the essential thickness of the semiconductor package 4 so as not to hinder the miniaturization of the semiconductor package 4. Because the projections 21 are formed at the corners of the square radiation plate 2, they can extend outwardly from the semiconductor package 4 at its corners where no lead is provided. Therefore, the projections 21 do not interfere with the original arrangement of the leads 63 of the semiconductor chip 1.

Figure 3:
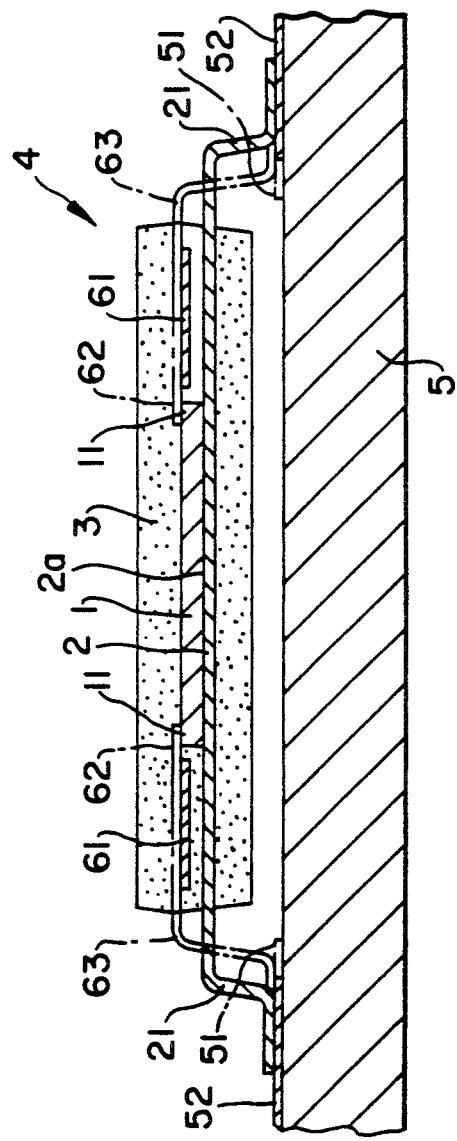
FIG. 3 is a cross sectional view showing the semiconductor package of FIG. 2 is mounted on a printed board.

The semiconductor package 4 is mounted on a printed board 5 made of, for example, glass epoxy or ceramics as shown in FIG. 3. The leads 63 of the semiconductor chip 1 and the projections 21 of the radiation plate 2 are bent in a so-called gull wing shape at the same time. The tip of each lead 63 is connected to the corresponding wiring pattern 51 of the printed board 5 by thermocompression bonding or soldering. The tip of each projection 21 is brought into close contact with and electrically connected to a ground pad 52 on the printed board 5 by thermocompression bonding or soldering. The ground pad 52 which is of copper foil or the like has a larger area than the wiring pattern 51. The ground pad 52 is connected to a ground terminal of the printed board 5 through a wiring pattern formed on the upper or lower surface of the printed board 5 or in the intermediate layer in the case of multi-layer printed board. With this configuration because the radiation plate 2 which is made of a material having a good heat conductivity is attached to the semiconductor chip 1, most of heat generated during the operation of the semiconductor chip 1 is conducted to the radiation plate 2 and radiated to the atmosphere from the projections 21 of the radiation plate 2 which are exposed, outside the plastic encapsulation 3. If the semiconductor chip 1 is sealed without a radiation plate 2 as is conventional, only a small amount of the heat generated by the semiconductor chip 1 can be released through thin and slender leads 63 of about 35 micron thickness. When the radiation plate 2 of the invention is used, the release of heat becomes remarkable because the radiation plate 2 contacts the semiconductor chip 1 over substantially the entire back surface of the semiconductor chip 1, and thus has large cross sectional area for conducting heat.

In the construction of FIG. 3, because the projections 21 of the radiation plate 2 are brought into close contact with the ground pads 52 of the printed board 5, heat is more effectively released in comparison with only heat radiation to the atmosphere. That is, because the ground pads 52 made of copper foil or the like have a large heat conductivity, heat conducted from the semiconductor chip 1 to the radiation plate 2 is effectively conducted to the ground pads 52 to be released through the printed board 5 which has a large surface area. In addition, because the radiation plate 2 is made of material which has a good electrical conductivity is attached to the back surface of the semiconductor chip 1 and electrically connected to the ground pads 52 of the printed board 5, the radiation plate 2 functions as a large ground electrode for the semiconductor chip 1. Therefore, charges in the semiconductor chip 1 and current induced by electromagnetic wave noise in the semiconductor chip 1 can be released to the ground pads 52 of the printed board 5 through the radiation plate 2. In addition, because the radiation plate 2 comes into contact with the semiconductor chip 1 over a large area and has cross sectional areas for conducting current, its resistance can be ignored and the ground potential of the semiconductor chip 1 can be maintained with high accuracy.

Next, a process for sealing the semiconductor chip 1 and the radiation plate 2 will be described with reference to FIGS. 3 and 4 in which TAB (Tape Automated Bonding) method is used.

Carrier tape 6 includes a polyimide film 61 and inner leads 62 formed on the polyimide film 61 to protrude inside an central aperture of the polyimide film 61. The inner leads 62 are bonded to the electrodes 11 formed on the surface of the semiconductor chip 1 so that the semiconductor chip 1 is electrically connected to the inner leads 62 and supported by the carrier tape 6 in the central aperture of the polyimide film 61 through the inner leads 62. Next, the radiation plate 2 is bonded to the back surface of the semiconductor chip 1 with electrically conductive adhesive. The radiation plate 2 may be bonded to the back surface of the semiconductor chip 1 before the inner leads 62 of the carrier tape 6 are bonded to the semiconductor chip 1. Next, the semiconductor chip 1 and the radiation plate 2 are sealed with plastic by transfer molding using a mold 7.

The mold 7 comprises an upper mold half 71 having a cavity 73 and a lower mold half 72 having a cavity 74. Two corners of each of the cavities 73 and 74 are designed in accordance with the construction of the radiation plate 2. That is, grooves 82 are formed at two corners of the cavity 74 so as to correspond to two projections 21 of the radiation plate 2. The depth of each groove 82 corresponds to the difference in height between the lead 63 and the projection 21. The projections 21 substantially fit in the grooves 82 without clearance. Pressing projections 83 are formed at two corners of the cavity 73 of the upper mold half 71 corresponding to the grooves 82 of the lower mold half 72. The pressing projections 83 fit in the grooves 82. Therefore, when the polyimide film 61 is sandwiched between the supporting surface 71a of the upper mold half 71 and the supporting surface 72a of the lower mold half 72 and the radiation plate 2 attached to the semiconductor chip 1 is positioned in the cavity 74 of the lower mold half 72, the two projections 21 of the radiation plate 2 in the grooves 82 are pressed by the pressing projections 83.

Molten plastic such as epoxy resin and silicone resin is injected into the cavities 73 and 74 through an injection hole 76 and gate grooves 77 and 78. The plastic encloses the semiconductor chip 1 and the radiation plate 2 so that three projections 21 of the radiation plate 2 extend outwardly from the plastic encapsulation 3. Air in the cavities 73 and 74 is exhausted through exhaust grooves 79 and 80 and an exhaust hole 81. Because the projections 21 are formed at three corners of the radiation plate 2 to avoid the corner at which the gate grooves 77 and 78 for injecting molten plastic are positioned, the projections 21 do not hinder the injection of molten plastic. Although one projection 21 of the radiation plate 2 is positioned in the exhaust grooves 79 and 80 in the construction of FIG. 4, it is of little consequence because the exhaust grooves 79 and 80 are for passing air.

After the plastic encapsulation 3 is completed, the outer leads 63 are severed from the polyimide film 61. The outer leads 63 and three projections 21 of the radiation plate 2 are then bent in a gull wing shape by using forming molds. The semiconductor package 4 thus obtained is mounted on the printed board 5 as described above.

Although an embodiment of the invention has been described, the invention is not limited to the above embodiment. For example, the shape and the dimension of the radiation plate may be changed in accordance with that of the semiconductor chip. The number of the projections of the radiation plate can also be varied. The position where each projection is formed may also be altered. The radiation plate may be attached to the surface having the electrodes of the semiconductor chip though it is attached to the back surface of the semiconductor chip in the above embodiment. Alternatively, a pair of radiation plates may be attached, one to each surface of the semiconductor chip. The projections of the radiation plate need not be connected to the printed board though they are bonded to the ground pads of the printed board for effective release of heat and for electrical connection in the above embodiment. In that case, it is desirable that the projections of the radiation plate are connected to a chassis made of material having a good heat conductivity or they are cooled with adequate liquid or gas. The radiation plate may be electrically connected to the printed board by using other wire leads.

In the present invention, heat generated in the operation of the semiconductor chip can effectively be released from the plastic encapsulation through the radiator attached to the semiconductor chip even if the entirety of the semiconductor chip is sealed. In addition, because heat generated when the semiconductor chip is sealed can also be released, the semiconductor chip is protected from heat during the manufacturing process of the semiconductor package. Because at least a projection is formed on the periphery of the radiator to extend laterally, the projection can be positioned within the essential thickness of the semiconductor package. Therefore, the miniaturization of the semiconductor package is not hindered. If the radiator is made of material having a good electrical conductivity and it is grounded, the semiconductor chip can electrically be protected.

Having described an illustrative embodiment of the invention with reference to the accompanying drawings, it is to be understood that the invention is not limited to such a precise embodiment, and that various further changes and modifications may be effected therein by one skilled in the art without departing from the scope and spirit of the invention as defined in the appended claims.

What is claimed is:

1. A radiator for a semiconductor chip comprising:
    a substantially planar plate element formed from a heat-conductive material and having a face to be attached to a face of the semiconductor chip, said plate element having an outer peripheral edge; and
    at least one projecting portion extending outwardly from the outer periphery of said plate element so as to extend outwardly, laterally beyond an outer periphery of the semiconductor chip, said projecting portion being located at a position to avoid outer leads of the semiconductor chip.

2. A radiator for a semiconductor chip according to claim 1, wherein said plate element is formed from an electroconductive material and is electrically connected to the back surface of the semiconductor chip.

3. A radiator for a semiconductor chip according to claim 1, wherein said plate element is square-shaped so as to correspond with the shape of the semiconductor chip and said projecting portion is formed at a corner of said plate element.

4. A semiconductor package comprising:
    a plastic encapsulation in which a semiconductor chip and a radiator attached to said semiconductor chip are sealed within plastic,
    said radiator including a plate element formed from a heat conductive material,
    said radiator further comprising at least one projecting portion extending outwardly from an outer periphery of said plate element so as to extend outwardly, laterally beyond an outer periphery of the semiconductor chip, and
    said projecting portion being located at a position to avoid outer leads of said semiconductor chip and exposed beyond said plastic encapsulation.

5. A semiconductor package according to claim 4, wherein said projecting portion is formed so as to avoid passages for molten plastic in a mold for forming said plastic encapsulation.

6. A semiconductor package according to claim 4, wherein said plate element is square-shaped so as to correspond to the shape of the semiconductor chip and said projecting portion is formed at a corner of said plate element.

7. A radiator attached to a semiconductor chip, the combination comprising:
    a radiator plate formed from a heat conductive material, for radiating heat from said semiconductor chip attached thereto; and
    a first projection member provided on said radiation plate so as to extend outwardly, laterally beyond a periphery of said semiconductor chip, said first projection member being located at a position to avoid outer leads of said semiconductor chip.

8. The combination according to claim 7, wherein said radiator further comprises a second projection member formed on said radiation plate so as to extend outwardly, laterally beyond the periphery of said semiconductor chip, said second projection member being located at a position to avoid outer leads of said semiconductor chip.

9. The combination according to claim 8, wherein said first and second projection members are each formed from the same material as said radiation plate.

10. The combination according to claim 7, wherein said radiation plate is formed from an electroconductive material, and is electrically connected to the back surface of said semiconductor chip.

11. The combination according to claim 7, wherein said radiation plate is square shaped so as to correspond to the shape of the semiconductor chip and said first projection member is formed at a corner of said radiation plate.

12. The combination according to claim 8, wherein said radiation plate is square-shaped so as to correspond to the shape of said semiconductor chip and said first and second projection members are respectively formed at corners of said radiation plate.

13. A plastic sealed semiconductor chip package, comprising:
    a semiconductor chip;
    a radiation plate formed from a heat conductive material, for radiating heat from said semiconductor chip attached thereto; and
    a projection member provided on said radiation plate so as to extend outwardly, laterally beyond a periphery of said semiconductor chip, said projection member being located at a position to avoid outer leads of said semiconductor chip.

14. A plastic sealed semiconductor chip package according to claim 13, wherein said projection member is formed from the same material as said radiation plate.

15. A plastic sealed semiconductor chip package according to claim 13, wherein said projection member is formed so as to avoid passages for molten plastic in a mold for sealing said semiconductor chip and said radiation plate in plastic.

16. A plastic sealed semiconductor chip package according to claim 13, wherein said radiation plate is square-shaped so as to correspond with the shape of the semiconductor chip and said projection member is formed at a corner of said radiation plate.

17. A semiconductor package mounted on a printed board, comprising:
  a plastic encapsulation in which a semiconductor chip and a radiator attached to said semiconductor chip are sealed within plastic,
  said radiator including a plate element formed from a heat-conductive material,
  said radiator further comprising at least one projecting portion extending outwardly from the outer periphery of said plate element so as to extend outwardly, laterally beyond an outer periphery of said semiconductor chip,
  said projecting portion being located at a position to avoid outer leads of said semiconductor chip, exposed beyond said plastic encapsulation and connected to a ground terminal of the printed board.

18. A semiconductor package according to claim 17, wherein said plate element is formed from an electroconductive material and electrically connected to the back surface of said semiconductor chip.

19. A semiconductor package according to claim 17, wherein said projecting portion is formed so as to avoid passages for molten plastic in a mold for forming said plastic encapsulation.

20. A semiconductor package according to claim 17, wherein said plate element is square-shaped so as to correspond with the shape of said semiconductor chip and said projecting portion is formed at a corner of said plate element.

21. A plastic sealed semiconductor chip package mounted on a printed board, comprising:
  a semiconductor chip;
  a radiation plate formed from a heat-conductive material, for radiating heat from said semiconductor chip attached thereto; and
  a projection member provided on said radiation plate so as to extend outwardly, laterally beyond a periphery of said semiconductor chip, said projection member being located at a position to avoid outer leads of said semiconductor chip and connected to a ground terminal of the printed board.

22. A plastic sealed semiconductor chip package according to claim 21, wherein said projection member is formed from the same material as said radiatiion plate.

23. A plastic sealed semiconductor chip package according to claim 21, wherein said radiation plate and said projection member are each formed from an electroconductive material and said radiation plate is electrically connected to the back surface of said semiconductor chip.

24. A plastic sealed semiconductor chip package according to claim 21, wherein said projection member is formed so as to avoid passages for molten plastic of a mold for sealing said semiconductor chip and said radiation plate in plastic.

25. A plastic sealed semiconductor chip package according to claim 21, wherein said radiation plate is square-shaped so as to correspond with the shape of said semiconductor chip and said projection member is formed at a corner of said radiation plate.

* * * * *